United States Patent [19]

Ishikawa et al.

[11] Patent Number: 5,405,656
[45] Date of Patent: Apr. 11, 1995

[54] SOLUTION FOR CATALYTIC TREATMENT, METHOD OF APPLYING CATALYST TO SUBSTRATE AND METHOD OF FORMING ELECTRICAL CONDUCTOR

[75] Inventors: Futoshi Ishikawa, Nagoya; Koji Kondo, Chiryu; Masahiro Irie, Kasuga, all of Japan

[73] Assignee: Nippondenso Co., Ltd., Kariya, Japan

[21] Appl. No.: 161,063

[22] Filed: Dec. 3, 1993

Related U.S. Application Data

[63] Continuation of Ser. No. 892,674, Jun. 4, 1992, abandoned, which is a continuation of Ser. No. 677,535, Apr. 2, 1991, abandoned.

[30] Foreign Application Priority Data

Apr. 2, 1990 [JP] Japan ................................ 2-84813
Apr. 3, 1990 [JP] Japan ................................ 2-87467
Mar. 14, 1991 [JP] Japan ................................ 3-049440

[51] Int. Cl.⁶ ........................ B05D 1/18; B05D 3/06
[52] U.S. Cl. ........................ 427/500; 427/581; 427/595; 427/596; 427/301; 427/437
[58] Field of Search ............... 427/437, 581, 595, 596, 427/301, 500; 106/1.19

[56] References Cited

U.S. PATENT DOCUMENTS

| | | | |
|---|---|---|---|
| 3,772,056 | 11/1973 | Polichette | 427/53.1 |
| 4,001,470 | 1/1977 | Schulze-Berge | 106/1.11 |
| 4,151,311 | 4/1979 | Feldstein | 427/53.1 |
| 4,153,746 | 5/1979 | Kilthan | 106/1.11 |
| 4,417,948 | 11/1983 | Mayne-Banton | 427/53.1 |
| 4,511,595 | 4/1985 | Inoue | 427/437 |
| 4,511,597 | 4/1985 | Teng | 427/53.1 |
| 4,574,095 | 3/1986 | Baum et al. | 427/53.1 |
| 4,717,421 | 1/1988 | Frisby | 106/1.11 |
| 4,863,758 | 9/1989 | Rhodenizer | 106/1.11 |
| 4,917,939 | 4/1990 | Matsuda | 428/411.1 |
| 4,986,848 | 1/1991 | Yamamoto | 106/1.11 |

FOREIGN PATENT DOCUMENTS

| | | | |
|---|---|---|---|
| 1201243 | 9/1986 | Japan | 427/53.1 |
| 3262548 | 10/1988 | Japan | 427/53.1 |

OTHER PUBLICATIONS

Mance & Waldo, Interactions of Electroless Catalysts with Photo-Oxidized Polymer Surfaces, Nov. 1988, J. Electrochem Soc. pp. 2729-2735.
Paunovic, Photochemical Selective Activation for Electroless Metal Deposition on Nonconductors, Sep. 1980, J. Electrochem Soc.
Baum, Photochemically Generated Gold Catalyst for Selective Electroless Plating of Copper, Jan. 1990, J. Electrochem. Soc.
Research Disclosure 31993, Nov. 1990, No. 319.
Julius Grant "Hackh's Chemical Dictionary" 4th ed. McGraw-Hill Co. 1969, pp. 699-700.

Primary Examiner—Shrive Beck
Assistant Examiner—Vi Duong Dang
Attorney, Agent, or Firm—Cushman, Darby & Cushman

[57] ABSTRACT

The present invention relates to a solution for catalytic treatment, which is effective for applying a catalyst-metal onto the surface of a substrate, which can provide a film having excellent properties such as adhesion, precision and selectivity through electroless plating or the like, and which does not cause a premature and undesirable decomposition in a bath. The solution for catalytic treatment comprises a catalyst-metal in the form of ions, which permits the deposition of the metal serving as a catalyst on a substrate by applying the solution onto the surface of the substrate and then irradiating the substrate with light rays. The present invention also relates to a method of applying a catalyst onto a substrate and a method of forming an electrical conductor in which such a solution for catalytic treatment is employed.

16 Claims, 8 Drawing Sheets

SOLUTION FOR CATALYTIC TREATMENT, METHOD OF APPLYING CATALYST TO SUBSTRATE AND METHOD OF FORMING ELECTRICAL CONDUCTOR

This is a continuation of application Ser. No. 07/892,674, filed on Jun. 4, 1992, which was abandoned upon the filing hereof; which was a continuation of Ser. No. 07/677,535, filed Apr. 2, 1991, now abandoned.

BACKGROUND OF THE INVENTION

1. Field of the Invention

The present invention relates to a solution for a catalytic treatment, and more specifically, to a solution for a catalytic treatment for use in adhering, to a substrate, metals serving as catalysts during an electroless plating or catalyst-metals involved in various catalytic reactions. The present invention also pertains to a method of applying a catalyst-metal to a substrate while using such a solution for a catalytic treatment, as well as a method of forming an electrical conductor on a substrate.

2. Description of the Related Art

Among the catalysts used in conventional electroless plating, most generally used is a Pd (palladium)-Sn (tin) colloid. Pd, however, serves only as a catalyst for the plating reaction, and Sn merely promotes the adhesion of Pd to a surface to be plated and often adversely affects the progress of the plating. For this reason, the plating is usually performed after adsorbing the Pd-Sn colloid to a substrate and then subjecting the substrate to an "Sn-extraction" treatment with an accelerator.

Figure 1A:
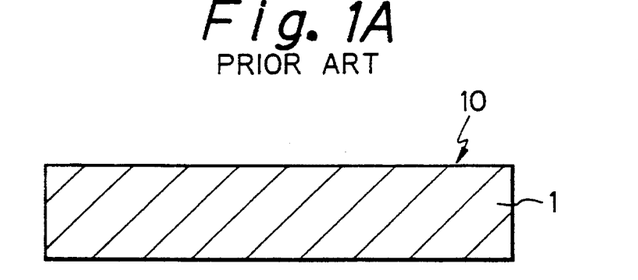
FIGS. 1A, 1B, 1C and 1D are cross sectional views illustrating, in sequence, the processes for the electroless plating in which a conventional Pd-Sn catalyst is employed.
Figure 1B:
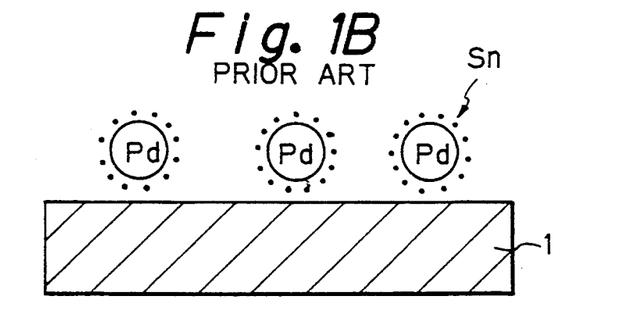
Figure 1C:
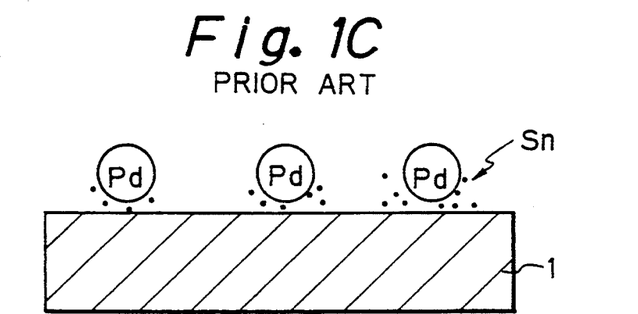
Figure 1D:
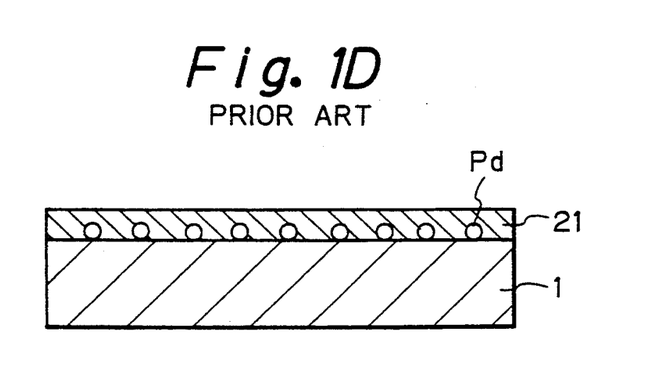

FIG. 1 shows the sequence of the processes of an example of a conventional electroless plating in which such a Pd-Sn colloid is employed as a catalyst:

First, as shown in FIG. 1A, there is provided a substance 1 to be plated; the surface 10 thereof to be plated having been cleaned. Then the substance to be plated is immersed in a Pd-Sn colloidal solution to apply the Pd-Sn colloid as a catalyst to the surface to be plated. The substance is then withdrawn from the colloidal solution to produce a substrate 1 to which Pd is adhered or adsorbed to the surface to be plated through an Sn layer surrounding the Pd particle or atom as shown in FIG. 1B. As mentioned above, the presence of Sn may adversely affect the plating reaction, and therefore, the substance to be plated is immersed in an appropriate accelerator solution for carrying out the Sn-extraction treatment, to thus remove any excess Sn as shown in FIG. 1C. After completion of the Sn-extraction treatment, the electroless plating is performed in the usual manner. The Pd nuclei effectively serve as a catalyst, and thus a plated film 21 is formed as shown in FIG. 1D.

This conventional method, however, suffers from some problems, most serious of which is that Pd-Sn is adsorbed, through the immersion, to the portions of the substance which should not be plated, and therefore, the catalyst is also present on such portions. This problem can be solved by forming a mask on the portions which should not be plated, with a resist or the like covering the catalyst layer formed, but the perpetual presence of the catalyst between the resist layer and the substrate becomes a cause of a deterioration of the electrical properties of the resulting articles. In addition, most of the Sn can be removed through the Sn-extraction process, but the substance to be plated is necessarily contaminated with Sn, and thus the plating reaction is sometimes interrupted. These two problems become serious when a more precise plating is intended.

A method in which a catalyst-metal palladium is directly deposited on the surface to be plated, without using Sn, is disclosed in, for example, Japanese Unexamined Patent Publication (hereinafter referred to as "KOKAI") No. 61-127868. In this method, metal palladium nuclei are applied to the surface by the vapor phase growth technique. Therefore, the use of a large-scale apparatus is necessary and there is still room for an improvement of the reliability and adhesion of a plated film to a substrate.

As for the foregoing electroless plating, attention must be paid to the formation of electrical conductor (electrodes, herein) on portions to which a catalyst can be applied only with difficulty. This problem is encountered in, for example, the production of an oxygen ($O_2$) sensor. This is because, when the electrodes of sensors such as an oxygen sensor are formed, as is well-known, a metal serving as a catalyst, i.e., a catalyst-metal must be applied to the surface of a substrate before plating with a metal to form the electrodes, but in this case, the catalyst-metal must be applied to an inner wall having a cup-like shape, which is very difficult in practice.

Figure 2A:
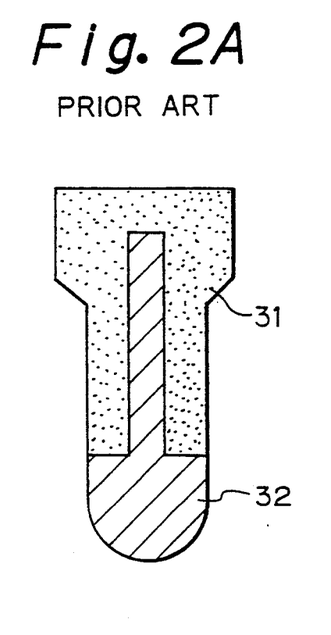
FIGS. 2A and 2B are cross sectional views schematically illustrating the partial formation of platinum electrodes on a substrate of an $O_2$ sensor.
Figure 2B:
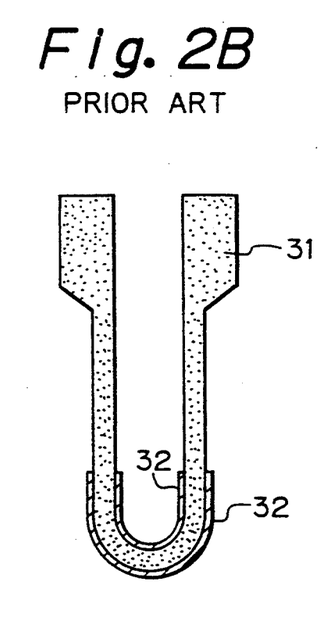

More specifically, an $O_2$ sensor comprises a substrate 31 made from a solid electrolyte having a cup-like shape, electrodes for determination disposed on both external and internal walls thereof, and a reference electrode 32 (Pt) as shown in FIG. 2, and these Pt electrodes are formed through a chemical deposition which comprises, for example, the following steps. To form the electrode, a catalyst (in general, metals such as Pd and Pt are used) serving as a nucleus for the plating must be applied to the surface of the substrate, as described above in connection with the electroless plating. The formation of the catalyst is performed by spraying the external surface of the substrate of the $O_2$ sensor with a mixture of selected catalyst-metal ions (such as Pd ions or Pt ions) and a reducing agent, and applying ions such as Pd or Pt ions to the internal surface of the substrate, drying for more than about 5 hours to evaporate moisture and adhere the ions to the surfaces, and then reducing the adhered ions to their elemental metal state. Thus, the application of the catalyst to the external surface of the substrate can be performed within a short period of time, but the application of the catalyst to the internal surface thereof is complicated and requires treatments that to be a long time, and this becomes a cause of an increase in the number of steps needed. In addition, this method of applying a catalyst does not permit a selective formation of a catalyst only on the desired portions on which electrodes are to be formed, and thus the entire surface of the substrate including both the external and internal surfaces thereof are covered. Accordingly, a film of expensive Pt must be formed even on portions of the surface of the substrate other than those on which electrodes are to be deposited through a chemical plating method. Namely, this method is also unfavorable from the economical viewpoint.

Under such circumstances, there have been proposed a variety of methods of partially applying a catalyst to the surface of a substrate, to thus permit a selective formation of Pt electrodes. For example, KOKAI No. 61-234351 proposes the use of an adhesive tape. More specifically, the method disclosed in this patent comprises masking, with an adhesive tape, portions of the surface of a substrate other than those on which Pt electrodes are to be formed, applying a catalyst under such a masking condition in a conventional manner, and then peeling off or removing the adhesive tape. In this method, however, the adhesive tape for masking must be applied to each article and although this reduces the cost of the electrode material (such as Pt), the number of steps is increased.

SUMMARY OF THE INVENTION

Accordingly, a first object of the present invention is to provide a solution for catalytic treatment which is effective for applying a catalyst-metal to the surface of a substrate, and therefore, for providing a film having various excellent properties such as an adhesion to the substrate, precision and selectivity during the electroless plating or the like, and which does not cause a decomposition of bath components used for forming a plated films.

A second object of the present invention is to provide an improved method of applying a catalyst to a substrate to be plated, in which the foregoing solution for a catalytic treatment is employed, and which is used for applying a metal serving as a catalyst on the surface of a substrate.

A third object of the present invention is to provide an improved method of forming an electrical conductor, in which the foregoing solution for catalytic treatment is employed, and which is effective for forming an electrical conductor on a substrate having a desired shape.

According to the present invention, the foregoing first object of the present invention can be achieved by providing a solution for a catalytic treatment which comprises a catalyst-metal in the form of ions, which permits the deposition of the metal serving as a catalyst or a catalyst-metal on a substrate by applying the solution to the surface of the substrate and then irradiating the substrate with light rays.

The solution for a catalytic treatment according to the present invention preferably comprises an organic complexing agent capable of complexing the catalyst-metal ions in addition to the ions.

The catalytic metal and the complexing agent can be added to the solution for a catalytic treatment in any amount, respectively, but the amounts thereof vary depending on various factors such as desired results. To the inventors' knowledge, however, the amount of the catalytic metal compound (e.g., $PdCl_2$) to be used usually ranges from about 0.00001 to 10 moles/l, and that of the complexing agent (such as malic acid) to be used ranges from about 0.00001 to 20 moles/l, on the basis of the total weight of the solution for catalytic treatment. In addition, the pH value of the solution for catalytic treatment is preferably not less than 2, more preferably 4 to 13. This pH value can be adjusted as usual by, for example, an addition of a proper acid or alkali.

According to a preferred embodiment of the present invention, the solution for catalytic treatment of the invention comprises palladium in the form of $Pd^{2+}$ ions and an organic complexing agent such as malic acid capable of complexing the $Pd^{2+}$ ions. The metal palladium can be deposited on the surface of a substrate to be plated by immersing the substrate in the solution or applying the solution to the surface and then irradiating the surface with light rays such as ultraviolet rays. The palladium is preferably used in the form of a salt such as $PdCl_2$.

According to the present invention, the second object thereof can be accomplished by providing a method of applying a catalyst to a substrate, which comprises, in the application of a metal serving as a catalyst to the substrate, bringing the substrate into contact with the above solution for a catalytic treatment containing the catalyst-metal ions, and then irradiating the substrate with light rays having a specific wavelength to apply the catalyst-metal to the substrate.

The third object of the present invention can be achieved by providing a method of forming an electrical conductor, which comprises, in the formation of an electrode on a substrate having a desired shape, bringing the substrate into contact with a solution for a catalytic treatment containing ions of a metal serving as a catalyst to adhere the ions to the surface of the substrate, irradiating the surface of the substrate with light rays having a specific wavelength able to convert the catalyst-metal ions into the catalyst-metal in the presence of the solution for a catalytic treatment, to thus apply the catalyst metal to the substrate, and plating the surface of the substrate with a metal for electrical conductor in the presence of the catalytic metal, to thereby form an electrical conductor.

BRIEF EXPLANATION OF THE DRAWINGS

FIGS. 8A, 8B and 8C are cross sectional views illustrating, in sequence, the formation of electrical conductors according to the method of carrying out a partial catalytic treatment of the present invention. cl DESCRIPTION OF THE PREFERRED EMBODIMENTS As understood from the foregoing description, the solution for a catalytic treatment and the method of applying a catalyst layer to the surface to be plated with the use of the solution are based on the photoreduction reaction of the catalyst-metal ions. More specifically, the method of applying a catalyst to the substrate according to the present invention is not based upon the use of a reducing agent as in the conventional methods, but upon the photoreduction reaction caused through an irradiation with light rays and an absorption of the light rays. The inventors of this invention have found, in the course of the studies for photo-reducing palladium ions ($Pd^{2+}$) onto a commonly used material such as a resin or an aluminum substrate, that a photoreduction reaction proceeds very rapidly on the surface of a specific material through an irradiation of light rays having a specific wavelength, if $Pd^{2+}$ ions and a complexing agent capable of complexing the $Pd^{2+}$ ions coexist on the surface, whereby Pd nuclei are formed and electroless plating of the surface can thus be performed, and as a result, completed the present invention.

The function of the present invention will be explained using palladium as a catalytic metal as an example.

The present invention is characterized in that a complexing agent for $Pd^{2+}$ as a component of the solution for catalytic treatment is added to the solution for preventing the reduction of $Pd^{2+}$ by the irradiation of light rays in a bath or on the surface in the absence of light rays. Accordingly, $Pd^{2+}$ is not directly reduced, and thus the decomposition thereof in the bath can be effectively prevented. Nevertheless, $Pd^{2+}$ is little reduced unless a complexing agent coexists. Namely, the complexing agent is used to cause the photoreduction reaction. Typical components of such a bath and the conditions for the photoreduction reaction are summarized in the following Table.

| Solution for Catalytic Treatment (pH = 7) | |
|---|---|
| Bath Component | Amount Used |
| Pd Cl$_2$ | 0.0001 mole/l (17.7 mg/l) |
| HCl | 100 ml/l |
| citric acid | 0.001 mole/l |
| Conditions for Irradiation with Light Rays | |
| Light Source . . . | Metal Halide Lamp |
| Irradiation Time . . . | about 2 minutes and 30 seconds |
| Electric Power . . . | 9 KW (about 90 A) |

To prepare the solution for catalytic treatment, PdCl$_2$ is dissolved in an HCl solution to give a solution acidified with HCl. $Pd^{2+}$ is strongly coordinated with $Cl^-$ in this solution however, and therefore a photoreduction reaction does not takes place. Therefore, the pH value of the solution must be controlled to the neutral region by the addition of an alkali such as NaOH. If the pH value of this solution is directly controlled to the neutral or alkaline range, however, $Pd^{2+}$ becomes unstable and is decomposed by the irradiation with light rays, i.e., $Pd^0$ is precipitated out in the all regions in the bath which are irradiated with light. In the present invention, it is intended to ensure that the photocatalytic reduction occurs only on the surface irradiated with light rays. Therefore, it is necessary to stabilize $Pd^{2+}$ to an extent such that a reduction thereof does not occur on the surface which does not show a photocatalytic effect or which does not absorb light. Under such circumstances, the inventors of this invention have investigated various complexing agents which cause a chelation of $Pd^{2+}$ to an extent sufficient to stabilize $Pd^{2+}$. Typical examples thereof include citric acid in the foregoing Table. In this case, $Pd^{2+}$ is generally bonded to carboxylic acid through a coordinate bond and thus stabilized. Accordingly, when a catalyst is applied only to ITO patterned on, for instance, a glass substrate with the use of the solution for a catalytic treatment having the composition listed in the foregoing Table, the surface of the ITO layer is optically excited by irradiating the substrate with light rays having a wavelength which is not absorbed by the glass but is absorbed by the ITO and ranges from 350 to 600 nm, and an optically catalyzed reduction reaction takes place whereby $Pd^0$ nuclei are not formed on the glass but are formed in the ITO region. This results in a chemical Ni-plating only in the ITO region, and thus a selective plating can be accomplished.

Moreover, in the method of forming electrodes according to the present invention, the mechanism for finally forming a good plating film, i.e., an electrode film, is basically the same as that used in the foregoing method for applying a catalyst, and a catalyst can easily be applied onto the desired region regardless of the shape of the substrate to be plated.

Figure 3A:
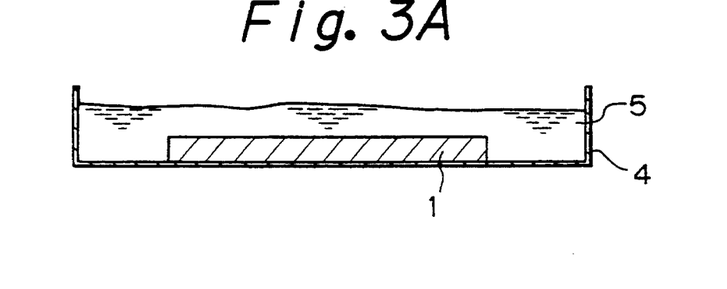
FIGS. 3A, 3B and 3C are cross sectional views illustrating, in sequence, the processes for the electroless plating according to the present invention.
Figure 3B:
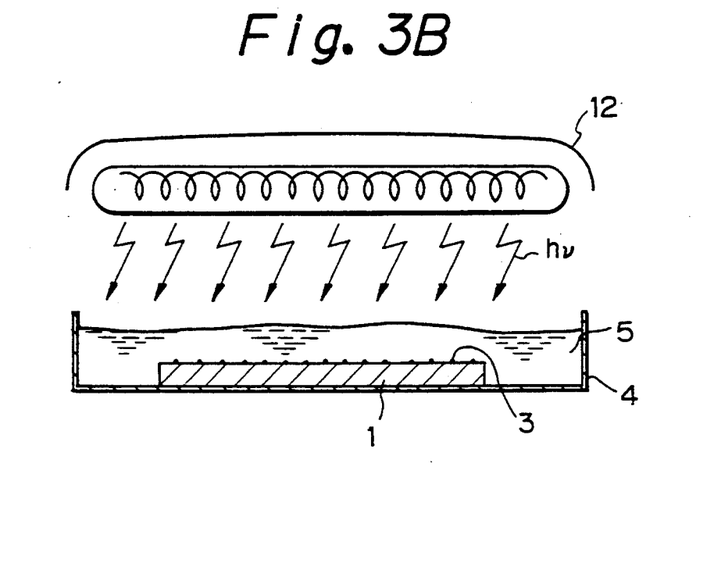
Figure 3C:
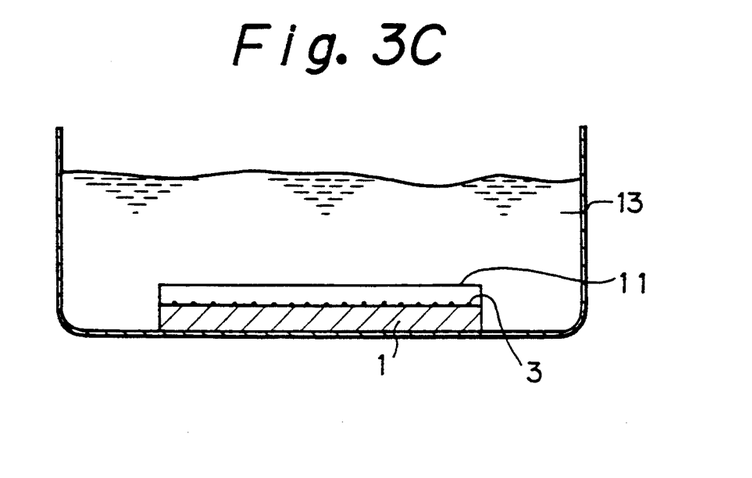

FIGS. 3A to 3C are cross sectional views showing in sequence the process for adhering a catalyst-metal to the surface to be plated (the application of the catalyst-metal to the surface), in which the solution for catalytic treatment according to the present invention is employed, and the subsequent process for electroless plating. The preferred embodiments of the present invention will be explained with reference to these figures below.

First, a substrate (substance to be plated) having a surface to be plated is provided. The substrate may be constituted by an insulating material such as a plastic, a ceramic or a glass material; a conductive material such as a metal; or a semiconductor material such as silicon. The surface to be plated is preferably subjected to a pretreatment and/or a cleaning treatment such as degreasing or washing with an alcohol.

Then the substrate 1 is immersed in the solution 5 for catalytic treatment according to the present invention as shown in FIG. 3A. The catalyst-metal ions used in the solution 5 for catalytic treatment contained in a bath 4 are not restricted as long as they can form metal nuclei serving as a catalyst in the method of the present invention, and as described above, preferred examples thereof are palladium, platinum, gold and silver. The present invention will be explained below using palladium as an example, but the present invention is not restricted to this specific example. In addition, the solution 5 for catalytic treatment is characterized in that it comprises an organic complexing agent. The complexing agents used herein are not restricted as long as they have the ability to complex the catalyst-metal ions. Preferred examples of the complexing agents used herein are citric acid, malic acid, malonic acid, sodium acetate, rochelle salt, NTA (nitrilotriacetic acid), EDTA (ethylenediaminetetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

The method of bringing the solution for catalytic treatment into contact with a substrate is not restricted to a specific method and the contact therebetween may be performed in accordance with any method known in the art, but preferably the contact is made according to a dip-coating method, a brush coating method, or the Langmuir-Blodgett technique (LB technique).

Figure 4A:
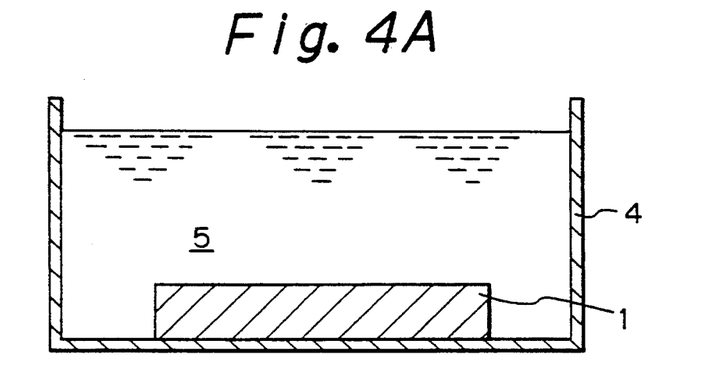
FIGS. 4A, 4B and 4C are cross sectional views schematically illustrating the formation of a catalyst-metal film according to the present invention.
Figure 4B:
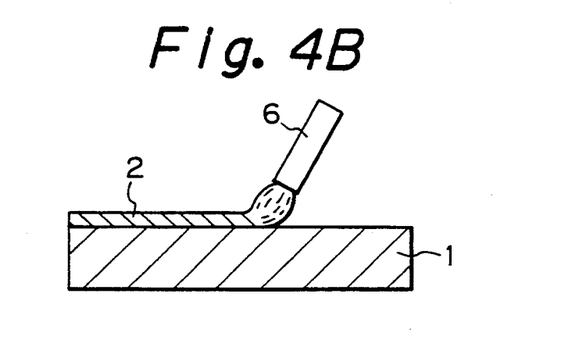
Figure 4C:
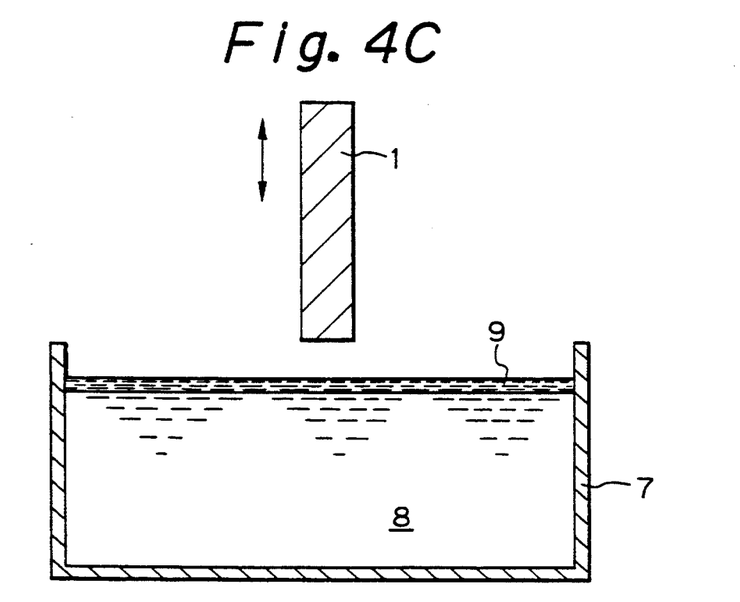

FIGS. 4A to 4C are diagrams explaining the methods of bringing the solution for catalytic treatment into contact with the substrate, wherein FIG. 4A shows an example of the dip-coating method. As will be seen from this figure, a solution 5 for catalytic treatment is introduced into an appropriate bath 4, a substrate 1 is immersed in the bath 4, and the substrate 1 is then withdrawn from the bath 4 and transferred to the light-irradiation process. FIG. 4B shows an example of the brush coating method whereby the solution 5 for catalytic treatment is applied onto the surface of a substrate with a brush 6. Note, of course the coating of the solution can be performed by any coating means other than a brush. FIG. 4C shows an example of the LB technique wherein a bath 7 is filled with water and a water film 9 containing catalyst-metal ions is spread over the surface of the water. The substrate 1 is then moved up and down, several times, with respect to the film surface of the catalyst film 9, to provide a compact and dense catalyst-metal film (not shown) on the surface of the substrate. It should be appreciated that methods for bringing the solution into contact with the substrate other than those shown in FIG. 4 may be used in the present invention, according to need.

The substrate 1 is then irradiated with light from a lamp 12 while immersing it in the solution for catalytic treatment 5 as shown in FIG. 3B. As explained above, this light-irradiation process is performed to precipitate, on the surface of the substrate, the catalyst-metal ions as catalyst-metal nuclei through a photoreduction of the metal ions in the solution, and may be carried out with a variety of lights from various light sources, such as ultraviolet rays or laser light rays. The lights and their wavelengths will vary depending on the absorption characteristics of substrates commonly employed or the absorption characteristics of the solution for catalytic treatment. For example, when an ITO coating film applied onto a glass substrate in a pattern is to be plated with a metal, preferably the light-irradiation process is performed with light which is not absorbed by the glass but by the ITO coating film, such as ultraviolet rays having a wavelength of not more than 500 nm.

When the resulting catalyst-metal nuclei are used as a catalyst for electroless plating, the substrate thus treated is then subjected to electroless plating as shown in FIG. 3C. This electroless plating can be performed in any conventional manner; for example, by immersing the substrate 1 in a chemical plating bath 13. Examples of such a chemical plating bath include a chemical nickel-plating bath and a chemical copper-plating bath. In this case, the plating proceeds while the catalyst-metal 3 serves as nuclei therefor to thus form a plated film 11. In this figure, the catalyst-metal is deposited on the entire surface of the surface to be plated, but if the surface to be plated comprises a patterned ITO film and the substrate serving as a ground surface comprises a glass as described above, the catalyst-metal is selectively deposited only on the patterned ITO layer and the plated film correspondingly formed only on the patterned ITO layer.

Specific examples of the foregoing electroless plating will be explained below.

EXAMPLE 1

A glass substrate on which a patterned ITO film having a thickness of 2,000 Å was applied was used as the substance to be plated in this Example. The surface of the substance to be plated was cleaned and then the entire substance was immersed in a solution for catalytic treatment having the following composition (pH=7) over 10 minutes.

| Composition of the Solution for Catalytic Treatment | |
| --- | --- |
| Component | Amount |
| PdCl$_2$ | 0.0001 mole/l |
| HCl | 100 ml/l |
| citric acid | 0.001 mole/l |

After the lapse of a predetermined time, the substance was irradiated from below with ultraviolet rays having a wavelength ranging from 350 to 500 nm while held in the solution for catalytic treatment (irradiation time of about 2.5 minutes), and it was observed that palladium was selectively deposited on the patterned ITO film. Subsequently, the substance was withdrawn from the solution for catalytic treatment and then immersed in a nickel-plating bath (pH=5.0) having the following composition, to perform an electroless plating.

| Component | Amount |
| --- | --- |
| Topnicolone ITO-90-M* | 100 ml/l |
| Topnicolone ITO-90-I* | 50 ml/l |

*These components are available from Okuno Pharmaceuticals Co., Ltd.

In this case, the temperature of the plating bath was 80° C. and the plating time was 5 minutes.

The plating proceeded while the palladium deposited on the patterned ITO film served as nuclei for plating, and thus a uniform nickel film having a film thickness of about 1 μm was obtained. It was confirmed that the boundary between the plated region and the non-plated region was clearly distinguishable and thus that the plating had proceeded with a good selectivity. Note, the exposed glass substrate was not covered with the nickel plating film at all.

Then the reactivity (rate of plated area occupied by the plated film on the ITO film) and the selectivity resulting nickel plating film was evaluated on the basis of the following standard, and as a result, the resulting plated Ni-film was evaluated as rank 5 in both reactivity and selectivity. This clearly indicates that the nickel plating was performed with a good selectivity.

| | Evaluation Standard Used | |
| --- | --- | --- |
| Evaluation | Reactivity (%) | Selectivity (%) |
| 5 | 100 | 100 |
| 4 | 75–99 | 75–99 |
| 3 | 50–74 | 50–74 |
| 2 | 25–49 | 25–49 |
| 1 | 1–24 | 1–24 |
| 0 | 0 | 0 |

Moreover, a tape-peel test was performed to evaluate the adhesion of the resulting plated Ni-film to the ITO film, in addition to the foregoing evaluation of the reactivity and selectivity, whereby an adhesive tape having a width of 1 cm was adhered to the plated Ni-film and the tape was peeled off in a direction at 90° C. thereto, to determine whether or not the Ni-film was simultaneously peeled off. It was confirmed that the Ni-film was not peeled off at all, and thus had good adhesion to the ITO film.

EXAMPLE 2 (COMPARATIVE EXAMPLE)

The same procedures as used in Example 1 were repeated, except that a solution for catalytic treatment having the following composition was used instead of the solution used in Example 1.

Experiment 1 ... A solution containing $PdCl_2$ and HCl (free of complexing agent; pH<1)
Experiment 2 ... An aqueous solution of $PdCl_2$ (pH>12)
Experiment 3 ... An aqueous solution of $PdCl_2$ (pH=7)
Experiment 4 ... An aqueous solution of $PdCl_2$ (pH<3)

In the above experiments, the resulting plated Ni-films were unsatisfactory. The same evaluation performed in Example 1 was made, and the results are listed in the following Table.

| Experiment No. | Reactivity | Selectivity |
|---|---|---|
| 1 | 0 | — |
| 2 | 0 | — |
| 3 | 5 | 1 |
| 4 | 0 | — |

EXAMPLE 3

This Example was made for evaluating the usefulness of a variety of compounds as complexing agents for Pd.

The same procedures as used in Example 1 were repeated, except that a variety of compounds having a complexing ability as listed in the following Table 1 were used as Pd-complexing agents. As seen from the evaluation (reactivity and selectivity) results listed in Table 1, compounds having a carboxyl group or a hydroxyl group in the molecule are useful as Pd-complexing agents.

TABLE 1

| Pd Complexing Agent | Reactivity | Selectivity |
|---|---|---|
| Malic acid | 5 | 1 |
| Rochelle salt | 5 | 1 |
| Malonic acid | 5 | 3 |
| EDTA | 3 | 5 |
| Sodium acetate | 5 | 5 |
| Quadrole | 0 | — |
| Triethanolamine | 0 | — |
| 2,2'-bipyridyl | 0 | — |
| Thiourea | 0 | — |

EXAMPLE 4

This Example was made for explaining the use of a variety of combinations of the substrates and the complexing agents.

The same procedures as used in Example 1 were repeated, except that a variety of compounds as listed in the following Table 2 were used as Pd-complexing agents, and as substrates, an ITO substrate, a glass plate, alumina substrates (96% and 92%), a glass-epoxy resin substrate and a glass-epoxy resin substrate coated with a rubber adhesive were used, and that the following conditions were changed as follows:

The pH values of the solutions for catalytic treatment . . . see Table 2

The light-irradiation ... This was carried out by irradiating with UV rays for 2.5 minutes (in a UV hardening furnace equipped with a metal halide lamp and having an output of 9,000 W).

Electroless Plating ... Ni-plating for one minute (Topnicolone (trade name) available from Okuno Pharmaceuticals Co., Ltd. was used as a Ni-plating bath)

The reactivity of the resulting plated Ni-films was evaluated on the basis of the following three stage evaluation standard (o: reaction on the entire surface; Δ: reaction on a part of the surface; and x: free of plating reaction). The results are summarized in the following Table 2.

TABLE 2

| Complexing agent | pH | ITO substrate | Glass substrate | Alumina substrate 96% | Alumina substrate 92% | Glass-epoxy resin substrate Free of adhesive | Glass-epoxy resin substrate Adhesive coated |
|---|---|---|---|---|---|---|---|
| Sodium acetate | 10 | Δ | x | x | x | x | Δ |
| TEA | 10 | x | x | o | o | Δ | o |
| HEA | 10 | x | x | Δ | Δ | Δ | o |
| Rochelle salt | 10 | o | Δ | o | o | x | o |
| Quadrole | 10 | Δ | Δ | o | o | o | o |
| NTA | 10 | Δ | x | o | o | o | o |
| 2,2'-bipyridyl | 10 | x | x | x | x | x | x |
| Malonic acid | 10 | Δ | x | x | x | x | x |
| EDTA | 10 | o | x | o | o | Δ | o |
| Malic acid | 10 | o | Δ | o | o | o | o |
| Citric acid | 10 | o | o | o | o | x | o |
| $OH^-$ | 13< | x | Δ | x | x | o | o |
| None (control) | 1> | x | x | x | x | x | x |

EXAMPLE 5

This Example is also made for explaining the use of a variety of combinations of the substrates and the complexing agents.

In this Example, the same procedures as used in Example 4 were repeated, except that the substrate was withdrawn from the bath of the solution for catalytic treatment, dried at 80° C. for 10 minutes and then irradiated with UV rays having a wavelength ranging from 350 to 500 nm for about 2.5 minutes, instead of irradiating from below with UV rays while the substrate was kept in the bath of the solution. The results are listed in the following Table 3.

TABLE 3

| Complexing agent | pH | ITO substrate | Glass substrate | Alumina substrate | | Glass-epoxy Resin substrate | |
|---|---|---|---|---|---|---|---|
| Sodium acetate | 10 | Δ | x | x | x | x | Δ |
| TEA | 10 | x | x | x | x | Δ | o |
| HEA | 10 | x | x | x | x | Δ | o |
| Rochelle salt | 10 | o | Δ | o | o | x | o |
| Quadrol | 10 | Δ | Δ | x | x | o | o |
| NTA | 10 | Δ | x | x | x | o | o |
| 2,2'-bipyridyl | 10 | x | x | x | x | x | x |
| Malonic acid | 10 | Δ | x | x | x | x | x |
| EDTA | 10 | o | x | x | x | Δ | o |
| Malic acid | 10 | o | Δ | o | o | o | o |
| Citric acid | 10 | o | o | o | o | x | o |
| OH⁻ | 13< | x | Δ | x | x | o | o |
| None (control) | 1> | x | x | x | x | x | x |

As seen from the results listed in Tables 2 and 3, the use of a complexing agent in the solution for catalytic treatment permits a photoreduction reaction of $Pd^{2+}$ on the surface of the substrate, to thus precipitate out $Pd^0$ thereon, and thus the $Pd^0$ precipitated out serve the catalyst for the plating reaction. Such a photoreduction reaction does not take place in the usual $Pd^{2+}$ solution (control). Moreover, it was found that the complexing agent must be properly selected depending on the kinds of the substrates used.

EXAMPLE 6

In this Example, various combinations of the complexing agents and the substrate were further investigated.

The same procedures as used in Example 4 were repeated, except that the complexing agents as listed in the following Table 4 were employed, and as a substrate, a 96% alumina ($Al_2O_3$) substrate or a glass substrate or that to which an adhesive layer had been applied was used, and that the pH value of the solution for catalytic treatment was changed as shown in this Table. The results are summarized in Table 4.

TABLE 4

| | Reactivity of plating | | | | | | | | |
|---|---|---|---|---|---|---|---|---|---|
| | Alumina Substrate | | | Glass-epoxy resin substrate | | | | | |
| | | | | Adhesive coated | | | Free of adhesive | | |
| Complexing agent | pH 4-5 | pH 7-9 | pH 12-13 | pH 4-5 | pH 7-9 | pH 12-13 | pH 4-5 | pH 7-9 | pH 12-13 |
| Sodium acetate | o | Δ | Δ | o | o | Δ | o | o | Δ |
| Malonic acid | o | o | Δ | o | o | Δ | o | o | Δ |
| Sodium succinate | o | o | o | o | o | o | o | o | o |
| Benzoic acid | Δ | x | x | o | Δ | x | o | Δ | x |
| o-Phthalic acid | o | o | o | o | o | o | o | o | o |
| m-Phthalic acid | o | o | o | o | o | o | o | o | o |
| p-Phthalic acid | Δ | Δ | Δ | o | o | x | o | o | x |
| Diphenic acid | Δ | o | Δ | o | o | x | o | o | x |
| Phenol | o | Δ | o | o | o | o | o | o | o |
| Catechol | o | o | o | o | o | o | o | o | o |
| Resorcinol | o | o | o | o | o | o | o | o | o |
| Hydroquinone | o | o | o | o | o | o | o | o | o |
| Pyrogallol | o | o | o | o | o | o | o | o | o |
| Hydroxyhydroquinone | o | o | o | o | o | o | o | o | o |
| Fluroglucine | Δ | x | o | o | o | o | o | o | o |
| Sodium malate | Δ | o | Δ | o | o | o | o | o | o |
| Sodium glucocheptonate | Δ | o | Δ | o | o | Δ | o | o | Δ |
| Citric acid | o | o | Δ | o | o | x | o | o | x |
| Rochelle salt | Δ | o | o | o | o | Δ | o | o | Δ |
| o-Hydroxybenzoic acid | Δ | o | o | o | o | o | o | o | o |
| m-Hydroxybenzoic acid | Δ | Δ | Δ | o | o | o | o | o | o |
| p-Hydroxybenzoic acid | Δ | x | Δ | o | Δ | x | o | Δ | x |
| 2,3-Dihydroxybenzoic acid | o | o | o | o | o | o | o | o | o |
| 2,4-Dihydroxybenzoic acid | o | o | o | o | o | o | o | o | o |
| 2,5-Dihydroxybenzoic acid | o | o | Δ | o | o | x | o | o | x |
| 2,6-Dihydroxybenzoic acid | o | o | o | o | o | o | o | o | o |
| 3,4-Dihydroxybenzoic acid | o | o | o | o | o | x | o | o | x |
| 3,5-Dihydroxybenzoic acid | Δ | x | Δ | o | o | Δ | o | o | Δ |
| Ethylonediamine | x | x | x | x | x | x | x | x | x |
| Diethylenetriamine | x | x | x | x | x | Δ | x | x | Δ |
| EDTA | x | x | x | Δ | Δ | o | Δ | Δ | o |
| Alamine | x | x | x | o | Δ | x | o | Δ | x |
| Glycine | Δ | x | x | o | x | Δ | o | x | Δ |
| Quadrol | x | x | x | Δ | o | Δ | Δ | o | Δ |
| TEA | Δ | x | x | o | Δ | x | o | Δ | x |
| HEA | x | x | x | o | Δ | Δ | o | Δ | Δ |
| Pyridine | x | x | x | x | x | o | x | x | o |
| 1,10-Phenanthroline | x | x | x | x | x | x | x | x | x |
| 2,2'-Dipyridylamine | x | x | x | x | x | x | x | x | x |

TABLE 4-continued

| | Reactivity of plating | | | | | | | | |
|---|---|---|---|---|---|---|---|---|---|
| | Alumina Substrate | | | Glass-epoxy resin substrate | | | | | |
| | | | | Adhesive coated | | | Free of adhesive | | |
| Complexing agent | pH 4–5 | pH 7–9 | pH 12–13 | pH 4–5 | pH 7–9 | pH 12–13 | pH 4–5 | pH 7–9 | pH 12–13 |
| 2-Aminopyridine | x | x | x | x | x | x | x | x | x |
| 2-Hydroxypyridine | ∆ | ∆ | ∆ | ○ | ○ | x | ○ | ○ | x |
| α-Picolinic acid | x | x | x | ∆ | ∆ | x | ∆ | ∆ | x |
| Aniline | x | x | x | x | x | x | x | x | x |
| 2,2′-Bipyridyl | x | x | x | x | x | x | x | x | x |
| 1,3′-Di-4-pyridylpropanol | x | x | x | x | x | x | x | x | x |

As will be seen from the results listed in Table 4, a good reactivity can be obtained if the complexing agents are organic complexing compounds having at least a carboxyl group or a hydroxyl group. In addition, it was found that some of the complexing agents which comprise a nitrogen atom do not necessarily provide a good reactivity.

EXAMPLE 7 (COMPARATIVE EXAMPLE)

This Example was made to determine whether or not the plating reaction takes place when heat (heating at 90° C.) is used for inducing the reaction, instead of the irradiation with light rays.

The same procedures as used in Example 4 were repeated, except that citric acid was used as a complexing agent and that each of the six kinds of substrates listed in Table 2 was immersed in the solution for catalytic treatment maintained at 90° C. for 10 minutes, instead of the irradiation with UV rays for 2.5 minutes, and thereafter, the nickel plating was performed in the same manner as in Example 4. No plated Ni-film was formed on all substrates, and thus it was considered that no reactivity was induced by heating. From the results thus obtained, it can be concluded that the solution for catalytic treatment according to the present invention functions only through the irradiation with light rays. Moreover, an Sn colloid for reducing a catalyst-metal is not used in the solution for a catalytic treatment of the present invention, and therefore, an adsorption of Sn to the substrate, which is a serious problem in the conventional methods, is not observed. For this reason, the pretreatment of the substrate and the maintenance of the materials to be used become very simple according to the present invention. Note, the method of the present invention is also effective when applying a general catalytic metal to a support, as a method of uniformly applying a catalyst-metal to a support.

EXAMPLE 8

The same procedures as used in Example 1 were repeated, except that a substrate of an epoxy resin was used, that a brush coating method was substituted for the dip-coating method in which the entire surface of the substrate was irradiated with light rays, and that malic acid or oleic acid was substituted for citric acid as a complexing agent in the solution for catalytic treatment. A good plated film was formed on the entire surface of the epoxy substrate.

EXAMPLE 9

The same procedures as used in Example 1 were repeated, except that an alumina substrate was used and that a palladium film was formed by the LB technique instead of the dip-coating method. More specifically, a shale was filled to the brim with water, several drops of a solution for catalytic treatment were dropped onto the surface of the water, and then the alumina substrate was moved up and down several times to form a palladium film on the substrate. Moreover, stearic acid was substituted for citric acid as a complexing agent for the solution for catalytic treatment. In this case, the stearic acid used for complexing palladium was a molecule having a high molecular weight, and therefore, the acid was uniformly spread over the entire surface of the water contained in the shale, and thus a good plated film was formed on the whole surface of the alumina substrate.

EXAMPLE 10 (COMPARATIVE EXAMPLE)

The same procedures used in the foregoing Example 1 were repeated except that the surface of the substrate to be plated was treated with a catalyst according to the conventional method using a Pd-Sn colloid. The resulting plated Ni-film having a thickness of about 1 μm had a good appearance, but when subjected to a tape peel test, it was found that a part thereof was peeled off, indicating that the adhesion of the plated film to the ITO film was poor.

EXAMPLE 11 (COMPARATIVE EXAMPLE)

The same procedures as used in Example 1 were repeated, except that a glass substrate free of a patterned ITO film was used. Although the glass substrate was treated under the same conditions used in Example 1, no palladium was deposited on the glass substrate at all, and accordingly, a plated Ni-film was not formed thereon (i.e., electroless plating of Ni did not take place).

Therefore, it can be concluded that the photoreduction reaction through the irradiation with light rays does not take place on the glass substrate at all.

Figure 5:
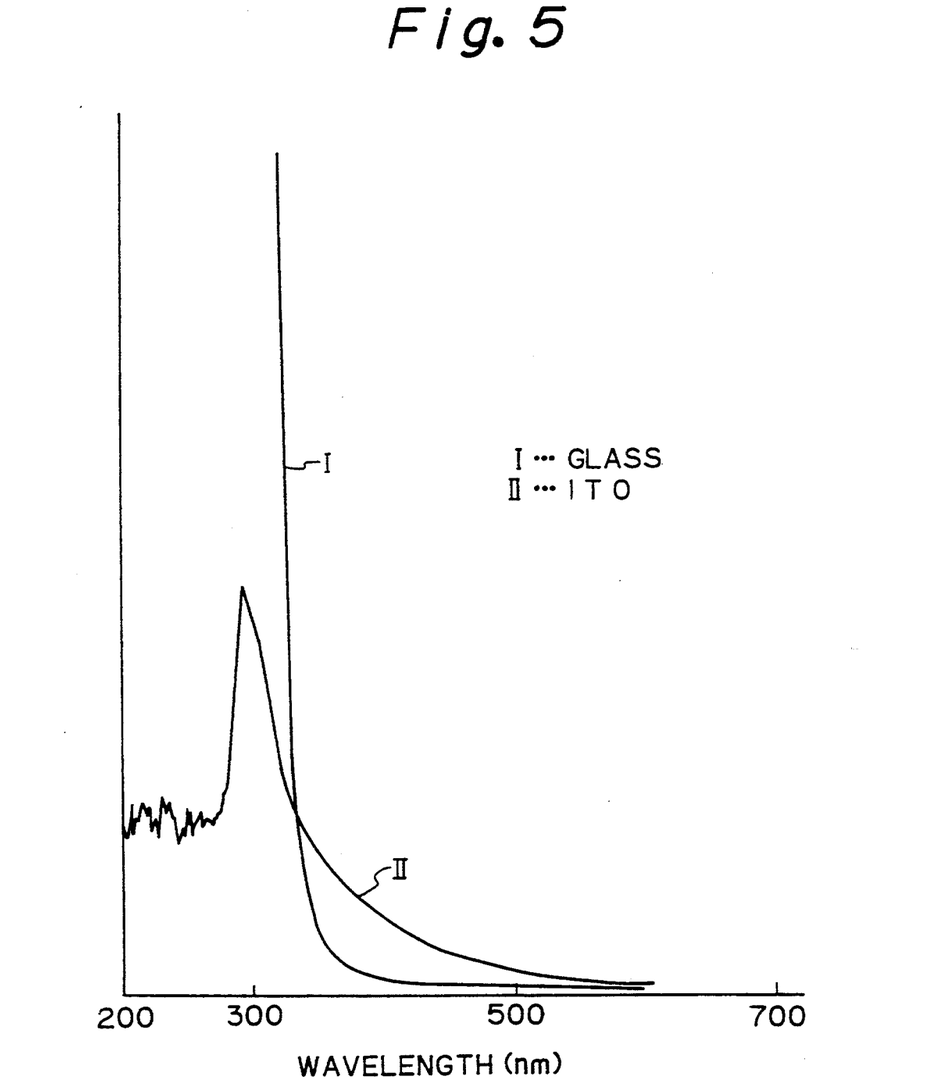
FIG. 5 is a graph showing the change in absorption spectra of the substrate.

This indicates that it is important to determine the absorption characteristics of the material for the substrate, i.e., the wavelength range of the light absorbed by the material for the substrate. For example, the UV absorption spectra of glass and ITO are shown in FIG. 5. As seen from FIG. 5, the ITO has an absorption at a wavelength of around 350 nm, but glass does not show any absorption at that wavelength, and thus it is obvious that light having a wavelength of about 350 nm contributes to the reaction on the ITO film.

EXAMPLE 12

The same procedures as used in Example 1 were repeated, except that the correlation between the wavelength of the irradiated light rays and the reactivity of electroless plating in both Ni-plating and Cu-plating on the surface of glass and an ITO film was determined. The results are summarized in Table 5.

TABLE 5

| Irradiation with light rays (light source: Metal Halide Lamp) | Presence (o) or absence (x) of plating | | | |
|---|---|---|---|---|
| | Ni | | Cu | |
| | Glass | ITO | Glass | ITO |
| Not irradiated | x | x | x | x |
| Irradiated (no wavelength cut off) | x | o | x | o |
| irradiated (cut off light rays having a wavelength of not more than 350 nm) | x | o | x | o |
| irradiated (cut off light rays having a wavelength of not more than 500 nm) | x | x | x | x |
| heated at 90° C. (without irradiation with light) | x | x | x | x |

As seen from Table 5, no plating reaction was observed on the glass surface at any wavelength used, while on the ITO film the catalyst (Pd) was deposited thereon by the irradiation with light rays having a wavelength of not more than 500 nm, and accordingly, the plating reaction was ensured. Moreover, the application of heat (heating at 90° C.) did not induce a reaction, and thus, it was determined reaction was a photoreduction reaction.

EXAMPLE 13

The same procedures as used in Example 1 were repeated, except that the substrates of ceramics and resin materials, which were commercially available, were substituted for the glass substrate and that as the solution for catalytic treatment, that employed in Example 1 (catalytic solution A) and the solution A in which malic acid was substituted for citric acid (catalytic solution B) were used. The quality of the resulting plated Ni-film was determined and the results are listed in Table 6.

TABLE 6

| Substrate | Catalyst Solution A | Catalyst Solution B |
|---|---|---|
| 96% $Al_2O_3$ | o | o |
| 92% $Al_2O_3$ | o | o |
| Epoxy resin | x | o |
| ABS resin | o | o |
| Phenol resin | o | o |

As seen from Table 6, the method of the present invention can be effectively used with any kind of method for applying a catalyst, and in electroless plating. Although the plating reaction does not proceed with the solutions for catalytic treatment as described herein, the reaction will proceed if the complexing agent used in the solution for catalytic treatment is properly selected.

EXAMPLE 14

This Example was made to clarify the difference between the adhesions achieved by the conventional method and the method of this invention.

The same procedures as used in Example 1 were repeated, except that a substrate of an epoxy resin was used as a substrate, and that in the conventional method, the catalytic treatment of the surface to be plated was performed according to the method using a Pd-Sn colloid as in the foregoing Example 10. After forming a plated Ni-film having a thickness of about 1 μm, a copper film of about 35 μm thick was applied onto the Ni film by an electroplating technique and then a peel test was carried out. Thus, the following difference between the adhesions was observed.

| Method | Adhesion (kg/cm) |
|---|---|
| Conventional Method | 0.6 |
| Method of the Present Invention | 1.6 |

It is believed that, according to the method of the present invention, $Pd^{2+}$ ions directly reacted with the surface of the substrate in this $Pd^{2+}$ photoreduction reaction, and thus the adhesion therebetween was high, although a detailed reaction mechanism has not yet been elucidated.

EXAMPLE 15

This Example explains the formation of an electrical conductor with reference to the formation of platinum electrodes of an $O_2$ sensor.

Figure 6A:
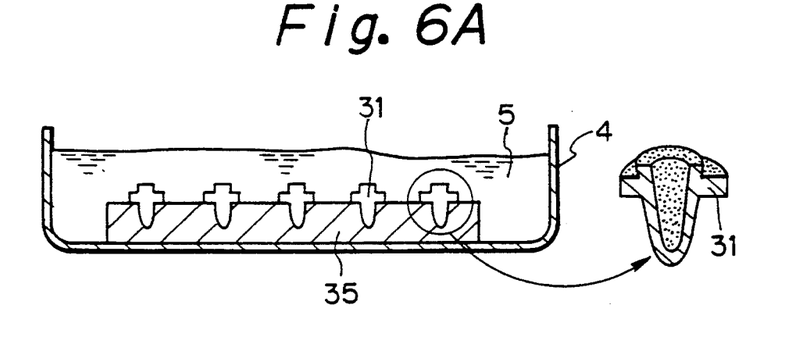
FIGS. 6A, 6B and 6C are cross sectional views illustrating, in sequence, the formation of electrical conductors with reference to the formation of electrodes of an $O_2$ sensor according to the present invention.

A substrate for the $O_2$ sensor comprising a $ZrO_2$ sintered body was immersed in a solution identical to the solution for catalytic treatment used in Example 1 for 10 minutes. More specifically, the solution for catalytic treatment used in this Example was a solution obtained by dissolving $PdCl_2$ and citric acid as an agent for complexing $Pd^{2+}$ ions and then adjusting the pH value thereof to 7 by the addition of NaOH. In this catalytic treatment, the substrate was held in the vertical position so that the internal wall thereof was also brought into close contact with the solution as shown in FIG. 6A. Then the substrate thus catalytically treated was washed with water and dried.

Thereafter, the entire surface of the substrate was irradiated with UV rays (having a wavelength ranging from 200 to 600 nm) for 5 minutes. The light source used in this irradiation process was a 500 W high pressure mercury lamp available from Ushio Electric Co., Ltd. After water washing, the substrate was subjected to electroless platinum plating at 30° C. for 22 hours in a plating bath available from Nippon Engerherdt Co., Ltd., and it was found that the plating reaction proceeded on the whole surface of the substrate and thus the Pt electrodes were formed. Moreover, an electrode was also formed on the internal wall thereof. Thus, it was confirmed that a catalyst could be applied onto a support through the photoreduction reaction according to the method of the present invention.

EXAMPLE 16 (COMPARATIVE EXAMPLE)

The same procedures as used in Example 15 were repeated, except that a complexing agent was not used in the solution for catalytic treatment and that the pH value of the solution was adjusted to 1. Although the electroless plating was carried out in the same manner as in Example 15, no plating reaction took at all and it was confirmed that $Pd^{2+}$ ions were not reduced.

EXAMPLE 17

In this Example, the formation of platinum electrodes in accordance with the method of partial catalytic treatment is explained.

The same procedures as used in Example 15 were repeated, except that laser rays were substituted for the UV light rays as the irradiation light. More specifically, the portions of the substrate on which platinum electrodes were subsequently formed were irradiated with laser light rays by scanning a laser beam on the desired surface portions of the substrate. Pd remained in the form of Pd²⁺ ions on the portions which were not irradiated with the laser beam, and thus the laser beam-irradiated substrate was immersed in a 50% hydrochloric acid solution maintained at 40° C. for 3 minutes to remove and dissolve the Pd²⁺ ions. When electroless plating was performed, the plating reaction proceeded only on the laser-irradiated portions, and thus Pt electrodes were selectively formed on both external and internal walls of the substrate.

EXAMPLE 18

In this Example, the formation of electrical conductors (platinum electrodes) in accordance with the method of partial catalytic treatment is explained.

The same procedures as used in Example 15 were repeated, except that EDTA as a complexing agent in the solution for catalytic treatment was employed and that the light-irradiation was performed through a mask in order to irradiate with light the desired surface portions of the substrate on which Pt electrodes were formed. When an electroless plating was performed, the plating reaction proceeded only on the UV-irradiated portions, and thus Pt electrodes were selectively formed on both the external and internal walls of the substrate.

EXAMPLE 19

Figure 6B:
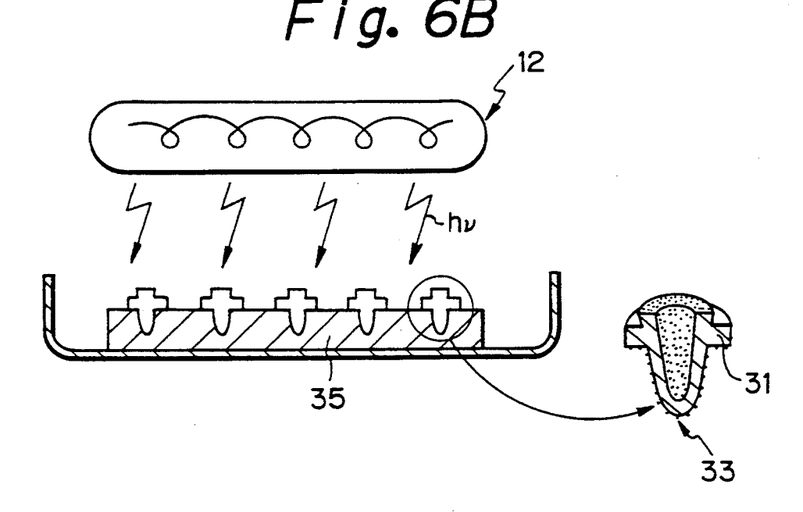
Figure 6C:
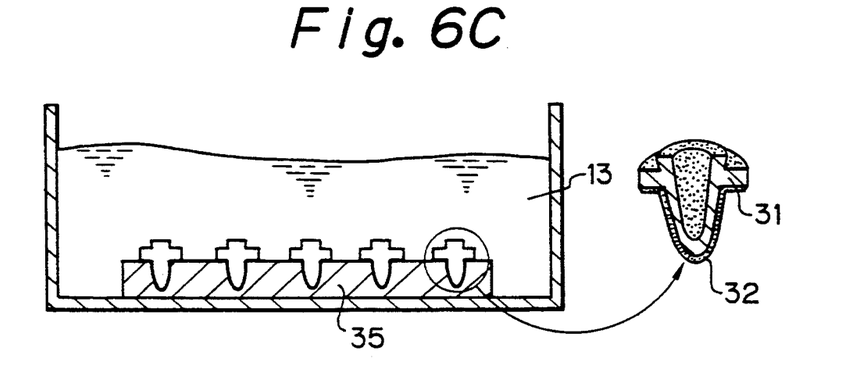

Each of FIGS. 6A to 6C; FIGS. 7A to 7D; and FIGS. 8A to 8C is a cross sectional view showing, in sequence, a process for forming electrodes (Pt electrodes) as the electrical conductor for an automotive $O_2$ sensor having a cup-like shape as shown in each figure, according to the present invention. In particular, FIGS. 7A to 7D and 8A to 8C are cross sectional views showing, in sequence, processes for producing a substrate 31 for an $O_2$ sensor provided with Pt electrodes 32 which are restricted in their distribution, as shown in FIG. 2, by the method of partially catalytically treating the substrate according to the present invention. Note, as materials for the substrate for the $O_2$ sensor there may be used, for example, a sintered body of an oxygen ion-conductive solid electrolyte such as $ZrO_2$ and $TiO_2$ as already explained above. Preferably the surface of the substrate is first cleaned by, for example, degreasing.

First, the formation of the Pt electrodes according to the present invention will be explained below with reference to FIGS. 6A to 6C.

The substrate 31 for an $O_2$ sensor comprises a $ZrO_2$ sintered body and has a cup-like shape, and requires both external and internal electrodes (see the enlarged view of the substrate 31 shown in FIG. 6A). As seen from FIG. 6A, a plurality of substrates 31 were placed on and supported by a tool 35 and immersed in a solution 5 for catalytic treatment contained in a shale 4. The preferred composition of the solution 5 for catalytic treatment has already been explained above. Pt²⁺ ions were adsorbed to the surface of the substrate 31 and then the substrate was washed with water and then dried.

Then the substrate 31 was irradiated with light from a lamp 12 as shown in FIG. 6B. In the light-irradiation process, it is preferable to use UV light rays having a wavelength ranging from 200 to 600 nm. This is because the light having a wavelength falling within the foregoing range is effective for reducing the catalyst-metal ions in the coexistence of a complexing agent to thus convert the ions into the stable catalyst-metal. As seen from the figure, the catalyst-metal is deposited on the surface of the substrate 31 of the $O_2$ sensor.

After washing with water, the substrate 31 of the $O_2$ sensor was immersed in a chemical plating bath 13 in the presence of the catalyst-metal to thus perform electroless plating of platinum as shown in FIG. 6C. After the lapse of a desired time, Pt electrodes 32 were formed on the surface of the substrate 31.

Figure 7A:
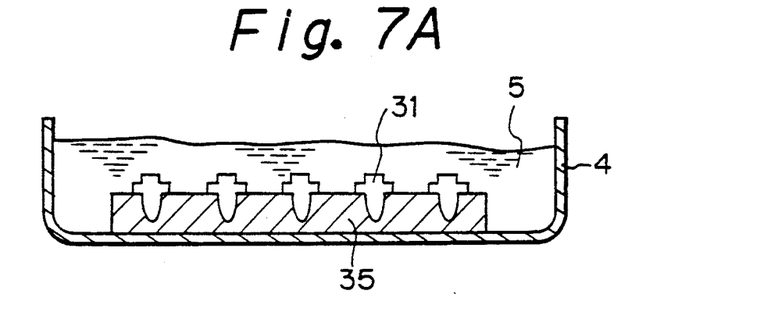
FIGS. 7A, 7B, 7C and 7D are cross sectional views illustrating, in sequence, the formation of electrical conductors according to the method for partial catalytic treatment of the present invention.
Figure 7B:
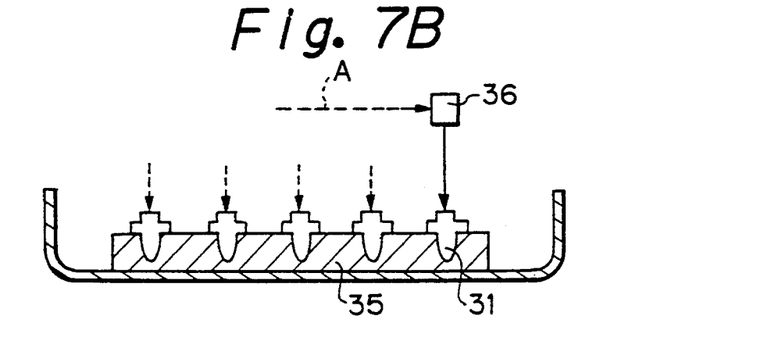
Figure 7C:
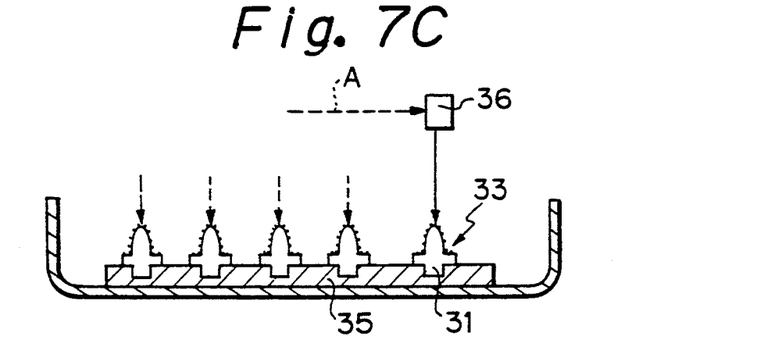
Figure 8A:
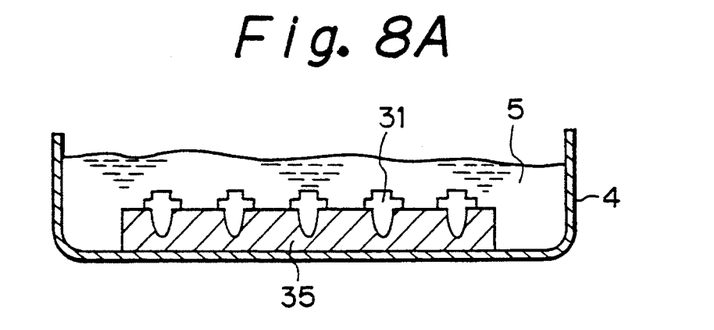
Figure 8B:
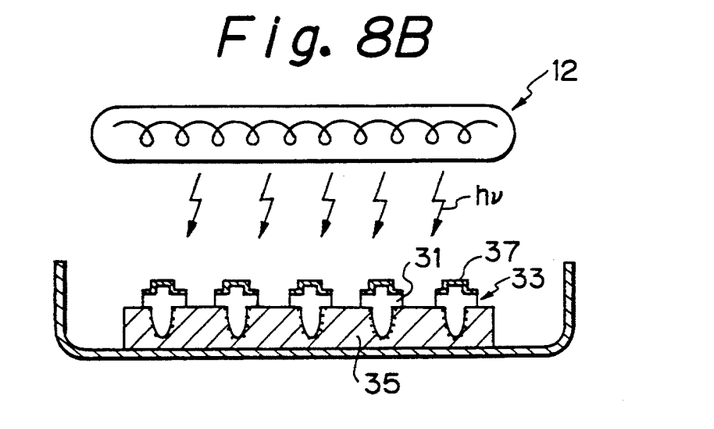
Figure 8C:
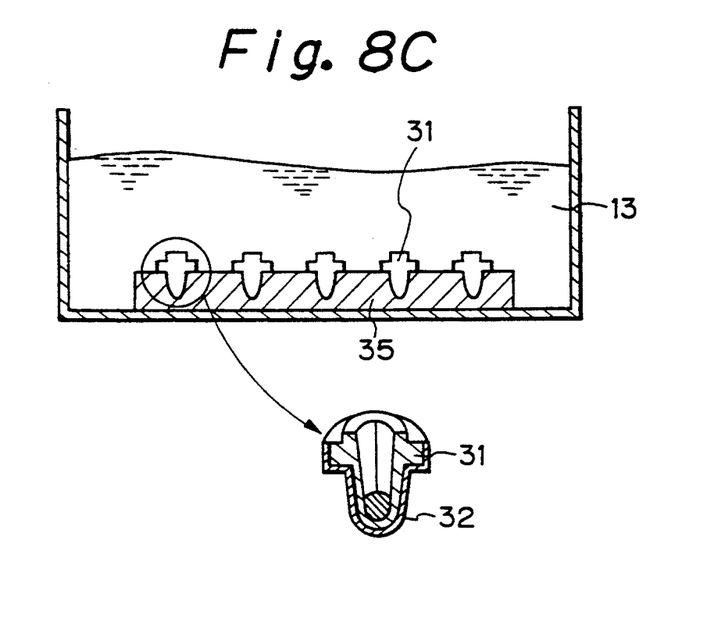

FIGS. 7A to 7D explain the formation of Pt electrodes according to the method of partially catalytically treating a substrate. In this method, the immersion of a substrate of an $O_2$ sensor in a solution for catalytic treatment as shown in FIG. 7A could be performed in the same manner as that shown in FIG. 6A. Then the substrate treated with a catalyst was selectively irradiated with light as shown in FIGS. 7B and 7C. In this Example, laser rays were used as the irradiation-light. Therefore, the predetermined portions on the substrate 31 placed on and supported by the tool 35 were selectively irradiated with laser rays by scanning the laser beam 36 along the direction indicated by an arrow A. FIGS. 7B and 7C show, respectively, the partial catalytic treatment of the internal wall of the substrate 31 and that of the external wall of the substrate 31. The catalyst-metal 33 was deposited on the regions which had been treated with the catalyst as shown in FIG. 7C. Then the catalyst-metal ions remaining on the regions which had not been irradiated with the laser beam were dissolved and removed. The removal of these catalyst-metal ions was carried out by immersing the substrate in an aqueous solution of a mineral acid such as sulfuric acid ($H_2SO_4$), hydrochloric acid (HCl) or nitric acid ($HNO_3$) or by washing the substrate with an aqueous solution of such a mineral acid. The processes for spraying a solution containing catalyst-metal ions on the internal wall of a substrate and for evaporating the moisture (drying for 5 hours) included in the conventional methods can be eliminated in accordance with this method, and thus the processing time can be substantially shortened. In addition, a partial plating also can be performed, and therefore, the cost of the plating can be greatly reduced.

Figure 7D:
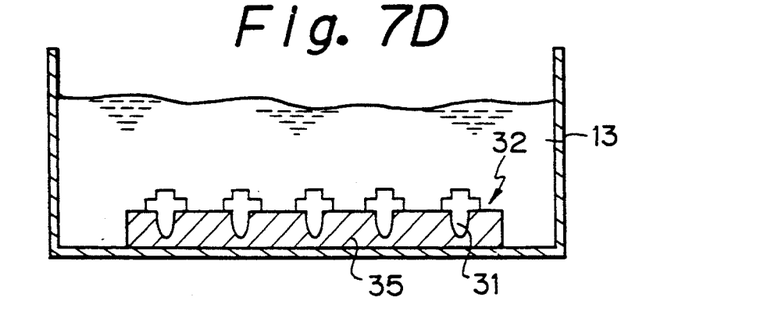

After completion of the partial catalytic treatment and water washing, electroless plating was performed as shown in FIG. 7D. More specifically, the substrate 31 of the $O_2$ sensor was immersed in a chemical plating bath 13 for plating platinum in the presence of partially formed catalyst-metal film. After the lapse of a desired time, Pt electrodes 32 were formed on the surface of the substrate 31.

FIGS. 8A to 8C illustrate the formation of Pt electrodes according to the method of partially catalytically treating a substrate. In this example, however, the substrate was irradiated with UV rays instead of a laser beam in the presence of a mask. In the method shown in this figure, the immersion of a substrate of an $O_2$ sensor in a solution for catalytic treatment as shown in FIG. 8A was performed in the same manner as that shown in FIG. 6A. Then the substrate treated with a catalyst was selectively irradiated with light as shown in FIG. 8B. In this Example, the irradiation-light used was the UV light rays from a lamp 12. The substrate was irradiated through a mask 37 for selective irradiation. The mask could be formed from, for instance, resist materials. As shown in FIG. 8B, the catalyst-metal 33 was thus deposited only on the portions of the surface of the substrate 31 which did not covered with the mask 37. Then the mask was removed and the catalyst-metal ions remaining on the surface of the substrate were dissolved and removed in the same manner as described above. In this respect, the removal of the mask and the catalyst-metal ions optionally could be performed simultaneously.

After completion of the partial catalytic treatment and water washing, electroless plating was performed as shown in FIG. 8C. More specifically, the substrate 31 of the $O_2$ sensor was immersed in a chemical plating bath 13 for platinum plating in the presence of the partially formed catalyst-metal layer. After the lapse of a desired time, Pt electrodes 32 were formed on the substrate 31.

As seen from the foregoing description, the present invention is effective for applying a catalyst-metal layer onto the surface of a substance to be plated, and can provide a plated film having excellent properties such as adhesion, precision and selectivity. The present invention can also provide a solution for a catalytic treatment which does not cause a premature and undesirable decomposition in a bath.

In addition, the present invention makes it possible not only to provide a plated film having good adhesion, at a high selectivity and high precision through simple treatments, but also to simplify pretreatments of substrates to be plated and maintenance of the materials used, since an Sn colloid for reducing a catalyst-metal ions is not used, and thus the adsorption of Sn to the surface of the substrate does not occur, which becomes a cause of the serious problem encountered in the conventional methods.

Moreover, the present invention makes it possible to apply a catalyst to the surface of a substrate in a satisfactory manner as detailed above, and to correspondingly form electrical conductors having excellent properties simply and easily at a low cost.

We claim:

1. A method of applying metal palladium capable of serving as a catalyst to the surface of a substrate, wherein the method comprises the steps of bringing the substrate into contact with a solution for catalytic treatment, the solution comprising palladium in the form of $Pd^{2+}$ ions and an organic complexing agent carrying at least a carboxyl group or a hydroxyl group in the molecule and not containing a reducing agent which can chemically reduce $Pd^{2+}$, and at the same time with or after the contact step, irradiating the substrate with light, said light having a specific wavelength or wavelengths producing an effect consisting of photoreduction of said ions, thereby applying metal palladium onto the surface of the substrate.

2. The method according to claim 1, wherein the organic complexing agent in the solution is selected from the group consisting of citric acid, malic acid, malonic acid, sodium acetate, rochelle salt, NTA (nitrilotriacetic acid), EDTA (ethylenediamine-tetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

3. The method according to claim 1, wherein the substrate is brought into contact with the solution for catalytic treatment by immersing the substrate in the solution for catalytic treatment and at the same time with or after withdrawal of the substrate from the solution, the substrate is irradiated with light, thereby applying the catalyst-metal onto the surface of the substrate.

4. The method according to claim 3, wherein the organic complexing agent in the solution is selected from the group consisting of citric acid, malic acid, malonic acid, EDTA (ethylenediamine-tetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

5. The method according to claim 1, wherein the substrate is brought into contact with the solution for catalytic treatment by coating the substrate with the solution for catalytic treatment and then the substrate is irradiated with light, thereby applying the catalyst-metal onto the surface of the substrate.

6. The method according to claim 5, wherein the organic complexing agent in the solution is selected from the group consisting of citric acid, malic acid, malonic acid, sodium acetate, rochelle salt, NTA (nitrilotriacetic acid) EDTA (ethylenediamine-tetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

7. The method according to claim 1, wherein the substrate is brought into contact with the solution for catalytic treatment by moving the substrate up and down at the boundary between water and the solution for catalytic treatment according to the Langmuir-Blodgett technique and then the substrate is irradiated with light, thereby applying the catalyst-metal onto the surface of the substrate.

8. The method according to claim 7, wherein the organic complexing agent in the solution is selected from the group consisting of citric acid, malic acid, malonic acid, sodium acetate, rochelle salt, NTA (nitrilotriacetic acid) EDTA (ethylenediamine-tetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

9. The method according to claim 1, wherein the light has a wavelength or wavelengths within the range from 200 to 600 nm and the whole of the surface of the substrate is irradiated with the light or only selected portions thereof are selectively irradiated with the light.

10. The method according to claim 1, wherein the light is produced by a laser and the surface of the substrate is selectively irradiated by scanning a laser beam on selected portions thereof.

11. A method of forming an electrical conductor on a substrate comprising the steps of:
  bringing a substrate into contact with a solution for catalytic treatment containing palladium ions serving as catalyst, to adhere the ions to the surface of the substrate, the solution comprising palladium in the form of $Pd^{2+}$ ions and an organic complexing agent carrying at least a carboxyl group or a hydroxyl group in the molecule and not containing a reducing agent which can chemically reduce $Pd^{2+}$;
  irradiating the surface of the substrate with light, said light having a specific wavelength or wavelengths producing an effect consisting of photoreduction of said ions, thereby converting the $Pd^{2+}$ ions into palladium metal in the presence of the solution for catalytic treatment to thus apply the palladium metal to the surface of the substrate; and pl plating the surface of the substrate with a conductor metal in the presence of the palladium catalyst to form an electrical conductor.

12. The method according to claim 11, wherein the organic complexing agent in the solution is selected from the group consisting of citric acid, malic acid, malonic acid, sodium acetate, rochelle salt, NTA (nitrilotriacetic acid) EDTA (ethylenediamine-tetraacetic acid), HEA (N,N,N',N'-tetrakis-(2-hydroxyethyl)ethylenediamine), TEA (triethanolamine), TIPA (triisopropanolamine), succinic acid, glucoheptonic acid, phenol, catechol, resorcinol, hydroquinone, pyrogallol, hydroxyhydroquinone, fluoroglucine, benzoic acid, o-phthalic acid, m-phthalic acid, p-phthalic acid, diphenic acid, o-hydroxybenzoic acid, m-hydroxybenzoic acid, p-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid and 3,5-dihydroxybenzoic acid.

13. The method according to claim 11, wherein the light has a wavelength or wavelengths within the range from 200 to 600 nm and the whole of the surface of the substrate is irradiated with the light or only selected portions thereof on which said electrical conductor is formed are selectively irradiated with the light in the presence of a mask.

14. The method according to claim 13, wherein when the substrate is selectively irradiated with the light, and said light having a wavelength or wavelengths ranging from 200 to 600 nm, the catalyst-metal ions remaining on the non-irradiated portions are dissolved and removed before the metal plating process.

15. The method according to claim 11, wherein the light is produced by a laser, only selected portions of the surface of the substrate on which said electrical conductor is formed are selectively irradiated with the light by scanning a laser beam on selected portions of the surface of the substrate, and the palladium metal ions remaining on the non-irradiated portions are dissolved and removed before the metal plating process and after the irradiation with the light.

16. The method according to claim 11, wherein the substrate is a sensing portion of an oxygen sensor and comprises a solid electrolyte material, and a platinum electrode is formed as the electrical conductor on the surface of the substrate.

* * * * *